US007383522B2

(12) United States Patent
Murgai et al.

(10) Patent No.: US 7,383,522 B2
(45) Date of Patent: Jun. 3, 2008

(54) CROSSTALK-AWARE TIMING ANALYSIS

(75) Inventors: Rajeev Murgai, Santa Clara, CA (US); Yinghua Li, Albany, CA (US); Takashi Miyoshi, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 304 days.

(21) Appl. No.: 11/178,111

(22) Filed: Jul. 8, 2005

(65) Prior Publication Data

US 2006/0080627 A1    Apr. 13, 2006

Related U.S. Application Data

(60) Provisional application No. 60/617,283, filed on Oct. 8, 2004.

(51) Int. Cl.
G06F 17/50    (2006.01)
G06F 9/45    (2006.01)

(52) U.S. Cl. .............................................. 716/6; 716/5

(58) Field of Classification Search ................ 716/4–6, 716/18
See application file for complete search history.

(56) References Cited

U.S. PATENT DOCUMENTS

| | | | |
|---|---|---|---|
| 6,378,109 B1* | 4/2002 | Young et al. ................... | 716/4 |
| 6,405,348 B1* | 6/2002 | Fallah-Tehrani et al. ........ | 716/4 |
| 6,615,395 B1* | 9/2003 | Hathaway et al. .............. | 716/6 |

OTHER PUBLICATIONS

Arvind, "Path Based Approach for Crosstalk Delay Analysis," Int. Conf. on VLSI Design, pp. 727-730, Jan. 2004, 5 pages.
Arvind, "Integrated Crosstalk and Oxide Integrity Analysis in DSM Designs," Int. Conf. on VLSI Design, pp. 518-523, Jan. 2001, 7 pages.
Bakoglu, "Circuits, Interconnections and Packaging," Addison Wesley.
Chen et al., "Analytic Models for Crosstalk Delay and Pulse Analysis Under NonIdeal Inputs," In ITC, 1997, 12 pages.
Chen et al., "Test Generation for Cross-Talk Induced Faluts: Framework and Computational Results," Asian Test Symposium, 2000, 6 pages.
Cong et al., "Improved Crosstalk Modeling for Noise Constrained Interconnect Optimization," ASP-DAC, pp. 373-378, 2001, 6 pages.

(Continued)

*Primary Examiner*—Jack Chiang
*Assistant Examiner*—Nghia M. Doan
(74) *Attorney, Agent, or Firm*—Baker Botts L.L.P.

(57) ABSTRACT

In one embodiment, a method for crosstalk-aware timing analysis includes accessing a design of a circuit and identifying critical paths in the design. Each critical path includes one or more victim interconnects and one or more cells. The method includes identifying potential aggressor interconnects associated with each victim interconnect and, for each victim interconnect, extracting parasitics of the victim interconnect and the potential aggressor interconnects associated with the victim interconnect. The method includes computing timing windows of the potential aggressor interconnects and computing a first timing of each cell and each victim interconnect on each critical path. The method also includes, for each critical path, generating timing waveforms of the potential aggressor interconnects, traversing the critical path from a start point on the critical path to an end point on the critical path, and, computing a second timing of each cell and each victim interconnect on the critical path according to a traversal of the critical path.

40 Claims, 2 Drawing Sheets

OTHER PUBLICATIONS

Devgan, "Efficient Coupled Noise Estimation for On-Chip Interconnects," ICCAD, Nov. 1997, 5 pages.

Ding et al., "Efficient Crosstalk Noise Modeling Using Aggressor and Tree Reductions," ICCAD, pp. 595-600, Nov. 2002, 6 pages.

Franzini et al., "Crosstalk Aware Static Timing Analysis: A Two-Step Approach," Int. Symposium on Quality Electronic Design, pp. 499-503, 2000, 5 pages.

Kahng et al., "On Switch Factor Based Analysis of Coupled RC Interconnects," DAC, pp. 79-84, Jun. 2000, 6 pages.

Kuhlmann et al., "Efficient Crosstalk Estimation," ICCD, 1999, 10 pages.

Odabasioglu et al., "PRIMA: Passive Reduced-Order Interconnect Macromodeling Algorithm," IEEE Transactions on Computer-Aided Design, 1997, pp. 1-8.

Pillage et al., "Asymptotic Waveform Evaluation for Timing Analysis," IEEE Transactions on Computer-Aided Design, pp. 352-366, Apr. 1990, 16 pages.

Rajappan et al., "An Efficient Algorithm for Calculating the Worst-Case Delay Due to Crosstalk ," ICCD, pp. 76-81, Oct. 2003, 7 pages.

Ringe et al., "Static Timing Analysis Taking Crosstalk into Account," DATE, pp. 639-649, May 1995, 5 pages.

Sasaki et al., "Building a Crosstalk Library for Relative Window Methods—Timing Analysis that Includes Crosstalk Delay Degradation," Proc. of the Asia-Pacific Conference on ASIC, Aug. 2000, 17 pages.

Sentovich et al., "SIS: A System for Sequential Circuit Synthesis," Memorandum No. UCB/ERL M92/41, Electronics Research Laboratory, College of Engineering, University of California, Berkeley, California, 94720, May 1992, 45 pages.

Vittal et al., "Crosstalk in VLSI Interconnections," IEEE Transactions on Computer-Aided Design, Dec. 1999, 9 pages.

Xiao et al., "Worst Delay Estimation in Crosstalk Aware Status Timing Analysis," ICCD, Oct. 2000, 8 pages.

* cited by examiner

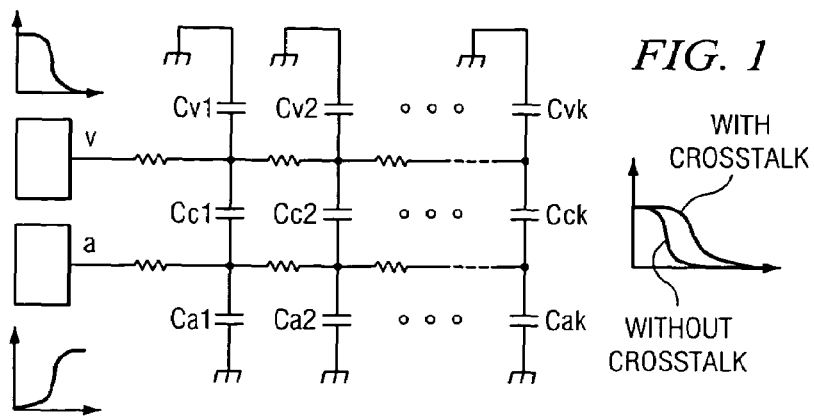
*FIG. 1*
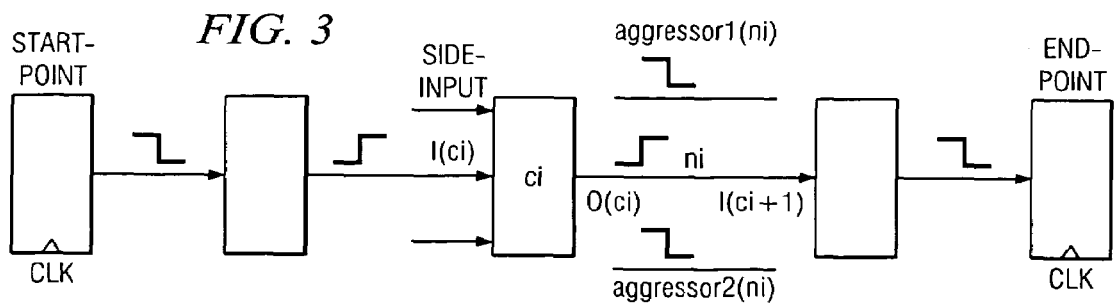

CROSSTALK-AWARE TIMING ANALYSIS

RELATED APPLICATION

This application claims the benefit, under 35 U.S.C. § 119(e), of U.S. Provisional Application No. 60/617,283, filed Oct. 8, 2004.

TECHNICAL FIELD OF THE INVENTION

This invention relates generally to circuit design and more particularly to crosstalk-aware timing analysis.

BACKGROUND

In deep sub-micron circuit designs, as wires have become taller and narrower while distances separating them from each other has decreased, coupling capacitance between adjacent interconnects has become a significant problem.

SUMMARY

According to the present invention, disadvantages and problems associated with circuit design may be reduced or eliminated.

In one embodiment, a method for crosstalk-aware timing analysis includes accessing a design of a circuit and identifying one or more critical paths in the design. Each critical path includes one or more victim interconnects and one or more cells. The method also includes identifying one or more potential aggressor interconnects associated with each victim interconnect and, for each victim interconnect, extracting one or more parasitics of the victim interconnect and the one or more potential aggressor interconnects associated with the victim interconnect. The method also includes computing timing windows of the potential aggressor interconnects and computing a first timing of each cell and each victim interconnect on each critical path. The method also includes, for each critical path, generating one or more timing waveforms of the potential aggressor interconnects according to the first timing of each cell and each victim interconnect on the critical path, the timing windows of the potential aggressor interconnects, and the parasitics of the victim interconnects on the critical path associated with the potential aggressor interconnects, traversing the critical path from a start point on the critical path to an end point on the critical path, and, using the timing waveforms of the potential aggressor interconnects, the parasitics of the victim interconnects on the critical path associated with the potential aggressor interconnects, and any second timing of any immediately preceding cell on the critical path, computing a second timing of each cell and each victim interconnect on the critical path according to the traversal of the critical path.

Particular embodiments of the present invention may provide one or more technical advantages. As an example, particular embodiments include an analysis tool for measuring the impact of crosstalk on delays of critical paths in a design. In particular embodiments, the crosstalk-aware delay information is useable by designers to modify the design to reduce or even prevent crosstalk. Compared with other approaches, particular embodiments of the present invention provide high delay-computation accuracy. Particular embodiments avoid use of approximate models for cells and nets and interconnect reductions. Particular embodiments employ a path-based approach, use detailed and accurate distributed RC parasitics for critical nets and their aggressors, use BSIM3-accurate gate models, and invoke accurate analysis tools, such as, for example, HSPICE, for delay computation using only the minimum complete set of input patterns.

Particular embodiments may provide all, some, or none of the technical advantages described above. Particular embodiments may provide one or more other technical advantages, one or more of which may be apparent, from the figures, descriptions, and claims herein, to a person having ordinary skill in the art

BRIEF DESCRIPTION OF THE DRAWINGS

To provide a more complete understanding of the present invention and the features and advantages thereof, reference is made to the following description, taken in conjunction with the accompanying drawings, in which:

FIG. 1 illustrates example crosstalk;

FIG. 2 illustrates an example crosstalk-aware timing analysis;

FIG. 3 illustrates an example path; and

DESCRIPTION OF EXAMPLE EMBODIMENTS

Figure 4:
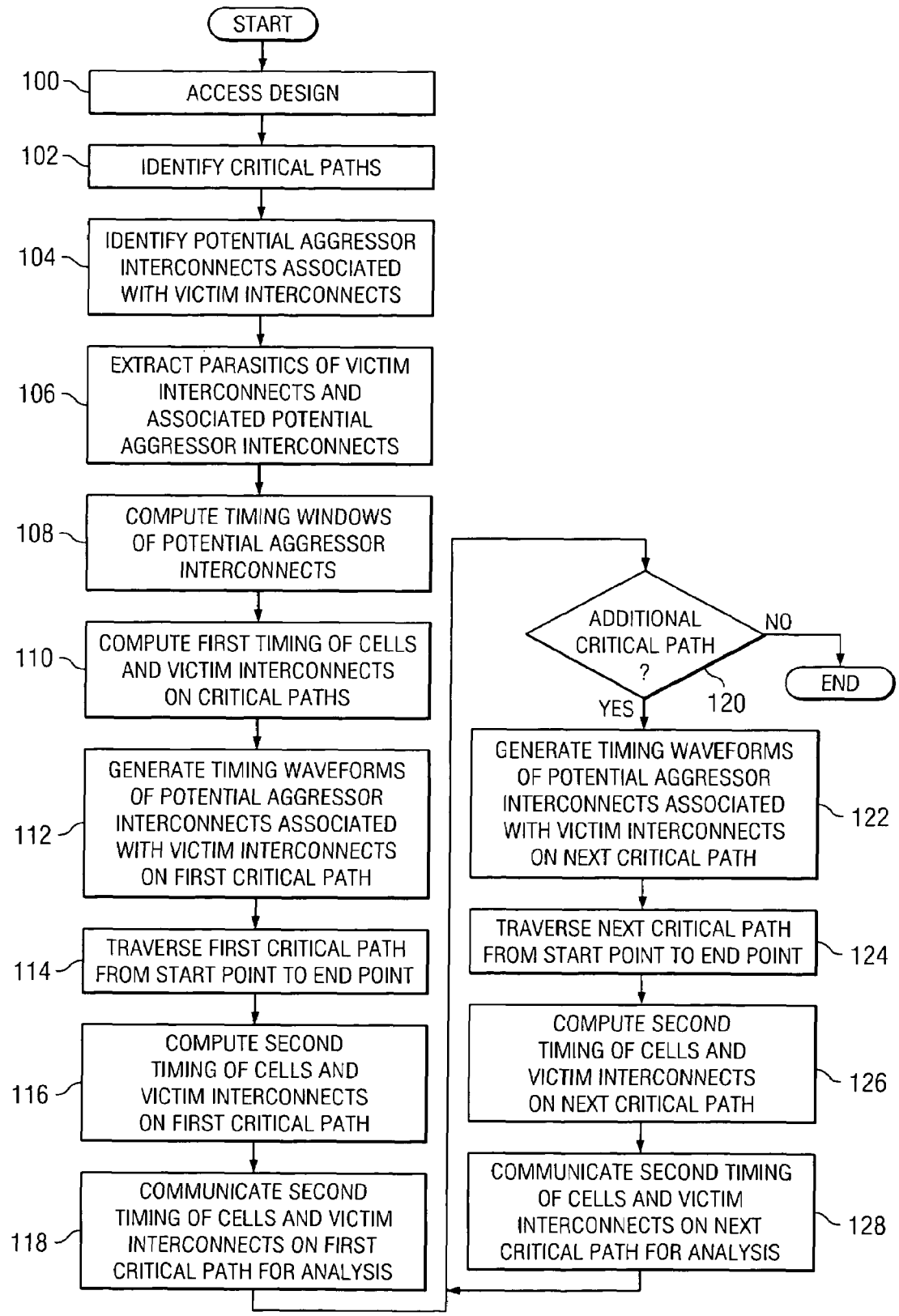
FIG. 4 illustrates an example method for crosstalk-aware timing analysis.

FIG. 1 illustrates example crosstalk. In deep sub-micron circuit designs, as wires have become taller and narrower while distances separating them from each other has decreased, coupling capacitance between adjacent interconnects has become a significant problem. As a result, crosstalk noise between physically adjacent nets (or interconnects) has become a significant problem. An affected net is a victim, v. A neighboring switching net causing noise affecting the victim v is an aggressor, a. Reference to an aggressor a encompasses one or more such nets, where appropriate. As FIG. 1 illustrates, when the aggressor a switches in a direction opposite the victim v, crosstalk may increase an arrival time at the victim v. When the aggressor a switches in the same direction as the victim v, crosstalk may decrease an arrival time at the victim v. Distributed coupling capacitance between v and a is shown as $C_ci$. Crosstalk may also result in logic hazards and circuit malfunction. For instance, if the delay change is large enough to render a critical path slower than the clock cycle (and thus cause a timing violation) or the large spike generated on the victim v due to capacitive coupling with an aggressor a is close enough to the clock edge to latch a wrong value at the target flip-flop, the circuit may malfunction. Accurate computation of the delay change due to crosstalk becomes important in the circuit design process. Particular embodiments of the present invention address this problem in the context of chip-level design and compute accurate path delays in the presence of crosstalk coupling.

Particular embodiments of the present invention provide an accurate analysis methodology and a tool for measuring the effects of crosstalk on path and circuit delay. In particular embodiments of the present invention, the tool is a hardware, software, or embedded logic component or a combination of two or more such components. In such embodiments, one or more computer systems provide user access to the tool. Particular embodiments of the present invention are path-based and do not suffer from the pessimism inherent in net-based analysis in previous approaches. For each path p under analysis, for a given victim net, the true aggressors and their switching times are computed based on the switching time of the victim net with respect to p. For a given path p, the delays through gates and nets in the path in the presence of crosstalk are computed very accurately using HSPICE. Particular embodiments of the present invention model nets as distributed RC networks. Macromodel reduction techniques need not be applied. Because crosstalk has a significant impact on gate delays, as well as net delays, accurate gate-delay model are important. Particular embodiments of the present invention use BSIM3 gate models, in contrast to the simple resistive models used in previous approaches. To compute gate delays, static timing analysis (STA) tools typically replace the interconnect parasitics at the output net by a single effective capacitance $C_{eff}$. Computation of $C_{eff}$ is approximate and an attempt to fit the output-load based cell delay model used in STA tools. In contrast, particular embodiments of the present invention use HSPICE and the complete RC network at the output net to compute the pin-to-pin delay through the gate, which provides substantial accuracy. For cell delay recomputation, particular embodiments of the present invention provide a method that generates a minimum number of patterns that should be simulated to derive a worst case pin-to-pin delay through a cell on a critical path for a given input-output pin pair and transition directions. Particular embodiments of the present invention generate SPICE-accurate delay reports for the critical paths for two scenarios: one in the presence of switching aggressors and coupling capacitances, and another in their absence. This allows designers to more readily see the impact of crosstalk.

Generally speaking, particular embodiments of the invention assume that a mapped, placed, and routed design is available, then recompute the delay of a set of critical paths in the presence of neighboring aggressor nets. Such embodiments first identify potential aggressor nets for each net v of a critical path p, then extract parasitics for v in the presence of the aggressors. The parasitics include distributed coupling capacitances, self capacitances, and resistances. Such embodiments then recompute p's delay by traversing p from the start point, recomputing the delay and slew through each cell on p and the associated output net v in the presence of the coupling capacitances and aggressor transitions.

Particular embodiments of the present invention involve the following input and output. Particular embodiments read a mapped and post-routed design, including a gate-level hierarchical netlist and placement and routing data. A designer may also provide an optional list P of paths that the designer wants to analyze for delay in the presence of capacitive coupling. If the designer provides such a list, the list should have actual arrival times and transition times for all points (or pads or pins) on each path of P. If the designer does not provide the path list P (which in particular embodiments is the default mode), particular embodiments will automatically generate an intermediate timing report $R_{pt}$ that contains the list P of critical and near-critical paths in the design. Particular embodiments also require a cell library and SPICE model files.

Particular embodiments of the present invention may invoke computer-assisted design (CAD) vendor tools for the following tasks: PrimeTime for STA, StarXtract for parasitic extraction, and HSPICE for circuit analysis and delay computation. These tools come from SYNOPSYS. Although particular tools are described for particular tasks, the present invention contemplates any suitable tools for any suitable tasks. The output of particular embodiments of the present invention are two timing reports, $R_{ct}$ and $R_{sp}$. The timing report $R_{ct}$ contains timing information for each path p in P in the presence of crosstalk. Particular embodiments report actual arrival times and slews at all points and delays through cells and nets on p. The second report $R_{sp}$ contains the same timing information, but in the absence of crosstalk from switching aggressors. A difference between $R_{sp}$ and the timing report $R_{pt}$ generated by PrimeTime is that $R_{sp}$ is generated using HSPICE. Since PrimeTime is usually pessimistic in comparison with HSPICE, e.g., PrimeTime reports higher delay numbers than HSPICE does, comparing $R_{ct}$ with $R_{sp}$ is preferable: both are generated using HSPICE and are more accurate than PrimeTime.

FIG. 2 illustrates an example crosstalk-aware timing analysis. In particular embodiments of the present invention, critical path generation 10 generates a set of critical paths P, if not already provided. All nets on P along with their directions, i.e., rise or fall, and arrival times constitute the set V of victim nets. For at least some designs, critical path generation 10 uses a PrimeTime script to generate this set. This script also reads in the net parasitics to model the interconnect. Let $t_{PT}$ be the path delay computed by PrimeTime. Any suitable static timing analysis may be used in place of PrimeTime. In particular embodiments of the present invention, aggressor net generation 12 computes, for each net n in V, the set of potential aggressor nets, A(n). These are the nets that are physically close to n. Given n, aggressor net generation 12 computes A(n) as follows. First, from the layout, all the net segments NS(n) of n and their end point coordinates are determined. Next, those segments in the entire design that are within some user-defined maximum distance (in terms of grids) from some segment in NS(n) are extracted. The owning nets of these segments determine the set of possible aggressor nets A(n) for n. In particular embodiments of the present invention, a user specifies the minimum length for which a net segment must run in parallel with a segment in NS(n) to qualify as an aggressor. Let $n \cup A(n) = S(n)$, also called the victim-aggressor set.

In particular embodiments of the present invention, parasitics extraction 14 generates, for each $n \in V$, the parasitics for the victim-aggressor set S(n). The parasitics form an RC network, which includes distributed net resistances, capacitances to ground, and coupling capacitances between the nets in S(n). FIG. 1 illustrates an example of such a network the victim v and a single aggressor a. In particular embodiments of the present invention, timing window generation 16 computes a timing window for each net m in $\cup_{n \in V} S(n)$. To reduce pessimism and false timing violations, the timing window preferably lists delays of all subpaths that pass through m, i.e., delays from their respective start points up to m, explicitly. However, a tool that generates such information is unavailable. In particular embodiments of the present invention, timing window generation 16 instead uses PrimeTime, which only computes the shortest and the longest paths. As a result, the timing window consists of min/max and rise/fall arrival times and transition times. These timing windows are used to generate aggressor nets' waveforms, which are used in subsequent SPICE simulations. In particular embodiments of the present invention, path delay recomputation 18 recomputes the delay of each critical path $p \in P$, taking into account coupling and aggressor information. FIG. 3 illustrates an example path p. Path p is an alternation of cells and nets, along with the transition direction (rise or fall) at each point. Path delay recomputation 18 traverses path p from the start point and recomputes delay of each cell $c_i$ from the input pin $I(c_i)$ to the output pin $O(c_i)$ and delay of net $n_i$ rooted at $O(c_i)$. Path delay recomputation 18 then updates the arrival time and transition time at the sink $I(c_{i+1})$ of $n_i$, which are later used to compute the delay of the stage i+1. This process continues until the new arrival time at the end-point of p is known.

The delays of the cell $c_i$ and net $n_i$ are computed in the presence of the entire parasitic RC network (including coupling capacitances in the nets $S(n_i)$) and transitions on the aggressor nets $A(n_i)$. To compute the maximum impact of the aggressor $\alpha \in A(n_i)$ on the victim delay, $\alpha$ should make a transition in a direction opposite to that of the victim $n_i$, if the timing window of $\alpha$ contains the actual arrival time of $n_i$ on the path p. The arrival time of $\alpha$ is identical to that of $n_i$, and its transition time or slew is the minimum slew in the appropriate direction. This timing information is obtained from STA. Note that, in general, the minimum slew on the aggressor will result in the maximum delay increase. When the aggressor $\alpha$'s timing window does not contain the arrival time of $n_i$, $\alpha$ is kept static at $V_{DD}$ (if $n_i$ is falling) or GND (if $n_i$ is rising). The arrival time, transition time, and direction (rising, falling, or constant $V_{DD}$/GND) together constitute the aggressor waveform.

The parasitics extracted for $n_i$ and $A(n_i)$ nets are combined with the aggressor waveforms into a SPICE deck. The only missing information in the deck is the values on the side inputs of the cell $c_i$. The side inputs of $c_i$ are all inputs of $c_i$ except $I(c_i)$. Note that the waveform on $I(c_i)$ is already known: it is based on the new arrival time and the transition time computed from the previous stage i−1. To measure the worst delay through $c_i$, all possible values should be specified at the side inputs of $c_i$. In particular embodiments of the present invention, the delay is measured with HSPICE for each case, and the maximum of all these delay values yields the worst pin-to-pin delay through $c_i$. This is the naïve approach for delay computation. Utilizing the information about sensitivity and input/output transitions at $c_i$ speeds up the delay characterization process significantly. For instance, if $c_i$ is a three-input AND gate, with critical input $I(c_i)=x_1$ rising and the output $O(c_i)$ also rising as a result, the naive approach requires four SPICE simulations, corresponding to the four vectors 00, 01, 10, and 11 at $x_2$ and $x_3$. However, the input transition at $x_1$ can propagate to the output only if the side inputs $x_2$ and $x_3$ are both 1. So, only one input vector needs to be applied and simulated. This is the preferred approach. In general, assume that the output $O(c_i)$ of the cell $c_i$ implements logic function $f(x_1, x_2, \ldots, x_m)$, where $I(c_i)=x_1$ is on the critical path. Without loss of generality, assume $x_1$ makes a rising transition and f makes a falling transition. Particular embodiments of the present invention compute the minimum set of patterns that should be simulated to compute the worst case delay from $x_1$ to the output f of the cell $c_i$ for the given pair of transitions on $x_1$ and f. Before $x_1$ rises, $x_1=0$ and $f=1$. This corresponds to the condition $g(x_2, x_3, \ldots x_m) = f_{x'_1}$, where $f_{x'_1}$ is the cofactor off with respect to $x_1=0$ and represents exactly those input combinations at $x_2$ through $x_m$ for which $f=1$ when $x_1$ is set to 0. After $x_1$ rises, f falls. The other inputs off do not change. The fluid state is $x_1=1$ and $f=0$. This corresponds to the condition $h(x_2, x_3, \ldots, x_m) = f'_{x_1}$, where $f'_{x_1}$ represents exactly those input combinations for which $f=0$ when $x_1$ is set to 1. Since the only input that has changed is $x_1$, the function $gh(x_2, x_3, \ldots x_m) = f_{x'_1} f'_{x_1}$ represents exactly all the combinations at $x_2$ through $x_m$ that are possible both before and after $x_1$ and f make transitions in the specified directions. $f_{x'_1} f'_{x_1}$ also represents the set of combinations for the case when $x_1$ falls and f rises. When both $x_1$ and f rise (or fall), the desired function is $f_{x_1} f'_{x'_1}$.

As an example and not by way of limitation, consider the above three-input AND gate example, where $x_1$ rises and f rises as a result. $f(x_1, x_2, x_3) = x_1 x_2 x_3$. $f'(x_1, x_2, x_3) = x'_1 + x'_2 + x'_3$. From the desired function $f_{x_1} f'_{x'_1}$, the function $f_{x_1} f'_{x'_1} = (x_2 x_3)$ $(1) = x_2 x_3$ yields all the $x_2$ and $x_3$ combinations under which rising $x_1$ can result in rising f. This implies $x_2 = x_3 = 1$.

In particular embodiments of the present invention, a library pattern generator 20 applies the above analysis to each input-output pin pair (and their transition directions) of all library cells, computes the above functions, and generates the minimum set of patterns that need to be simulated. Library pattern generator 20 may, but need not, be a Sequential Interactive Synthesis (SIS)-based library preprocessor. Particular embodiments of the present invention incorporate these patterns and compute the worst delay through $c_i$ from the input pin $I(c_i)$ to the output pin $O(c_i)$. Such embodiments compute arrival time at $O(c_i)$ from the arrival time at $I(c_i)$ and the cell delay. Corresponding to this worst case, such embodiments also use HSPICE to measure the new net delay from $O(c_i)$ to $I(c_{i+1})$ (which in turn determines the new arrival time at $I(c_{i+1})$) and the transition time at $I(c_{i+1})$. This completes the delay recomputation through the cell $c_i$ and net $n_i$. Repeating this for all the stages of p computes p's new delay, $t_{CT}$, which may be referred to as the crosstalk-aware delay.

Since PrimeTime and HSPICE can yield different delay values, for an accurate computation of delay change due to crosstalk, particular embodiments of the present invention recompute the path delay of p by repeating the above delay computation process, but without using any aggressor switchings. In other words, all aggressors are assumed to be either at $V_{DD}$ or GND, which effectively replaces the coupling capacitances in $S(n_i)$ with capacitances to ground. The path delay thus obtained is called the SPICE delay ($t_{SP}$).

As an example and not by way of limitation, particular embodiments of the present invention may be applied to two industrial designs: $D_1$ and $D_2$. Both use 0.11-μ technology and have a $V_{DD}$ of 1.2V. Table 1 shows the numbers of cells and nets in these two designs. The designs are analyzed after they have been successfully placed and detail-routed. The layout parasitics are also extracted and used in the STA tool PrimeTime Version 2002.03-SP1.

TABLE 1

| Benchmark Statistics | | |
| --- | --- | --- |
| Design | # Cells | # Nets |
| D1 | 165K | 167K |
| D2 | 454K | 460K |

1K = 1000
Both benchmarks correspond to 0.11μ technology.

First, the results on $D_1$ are reported. Initially, PrimeTime reports 65 critical or near-critical paths in $D_1$. Out of these, only 36 are unique: 29 are found to be duplicates and removed. This utility reduced run-time by a factor of almost two, since the run-time is roughly linear in the number of paths analyzed. The total number of critical or victim nets on these 36 paths is 130. The total number of aggressor nets is 309. On average, there are about 2.4 aggressor nets per victim net. It turns out that 68 victim nets have no neighboring aggressor nets. Particular embodiments of the present invention are applied to each of the 36 paths to compute $t_{SP}$ (HSPICE delay without crosstalk) and $t_{CT}$ (HSPICE delay in the presence of crosstalk). It turns out that only 11 of these paths have a delay change of more than 10 picoseconds, i.e., $\Delta t = t_{CT} - t_{SP} \geq 10$ picoseconds. Table 2 provides delay information for each of the 11 paths. Paths 7 and 10 have maximum $\Delta t$: more than 350 picoseconds. This prompts further investigation, which discovers that, on path 7, there is a net nil that has four aggressors. $n_{i1}$ had an overlap length of 950μ with two of them and 180-255μ with the other two. On path 10, there are two nets with significant overlaps: 400-650μ. These paths, their $t_{SP}$ and $t_{CT}$ delays, and the overlap lengths with aggressors are reported to the designers, who verify that coupling causes these paths to become longer and moves the relevant victim and aggressor nets away from each other to reduce the delay increase.

TABLE 2

Critical path delays by PrimeTime, HSPICE, and crosstalk-aware analysis for $D_1$

| Path | $t_{PT}$ | $t_{SP}$ | $t_{CT}$ | $\Delta t = t_{CT} - t_{SP}$ | $\Delta g$ | $\frac{\Delta g}{\Delta t}$ (%) |
|---|---|---|---|---|---|---|
| 1 | 3754.5 | 3641.83 | 3682.85 | 41.02 | 34.29 | 83.6 |
| 2 | 3769.3 | 3663.32 | 3703.21 | 39.89 | 33.22 | 83.3 |
| 3 | 3769.1 | 3663.13 | 3703.02 | 39.89 | 33.22 | 83.3 |
| 4 | 3768.73 | 3668.61 | 3707.47 | 38.86 | 32.19 | 82.8 |
| 5 | 3767.42 | 3661.60 | 3701.49 | 39.89 | 33.22 | 83.3 |
| 6 | 1672.37 | 1641.73 | 1657.86 | 16.13 | 9.54 | 59.2 |
| 7 | 4057.18 | 4027.49 | 4379.20 | 351.71 | 350.35 | 99.6 |
| 8 | 1653.58 | 1626.83 | 1637.37 | 10.54 | 10.54 | 100.0 |
| 9 | 1404.57 | 1335.93 | 1354.03 | 18.10 | 14.97 | 82.7 |
| 10 | 4089.96 | 4015.67 | 4384.56 | 368.89 | 347.88 | 94.3 |
| 11 | 1348.9 | 1294.35 | 1332.07 | 37.72 | 37.72 | 100.0 |

All delays are in pHs.

For the second design, $D_2$, PrimeTime reports sixty unique critical paths. In all, there are 450 victim nets on these paths. They have a total of 247 aggressor nets. It turns out that 336 critical nets do not have any aggressors. Particular embodiments of the present invention find four paths having delay increases of more than 10 picoseconds. These paths are listed in Table 3. The main reason why $D_2$ experiences less impact from crosstalk than does $D_1$ is that the average number of aggressors per victim net was 0.55 in $D_2$ and 2.4 in $D_1$. This is because $D_2$ had already been optimized by the designers for crosstalk prevention. This version of the design is obtained after increasing the spacing between the net segments that have significant coupling. Any overlap of smaller than 20μ between two net segments tends not to result in significant coupling capacitance.

TABLE 3

Critical path delays by PrimeTime, HSPICE, and crosstalk-aware analysis for $D_2$

| Path | $t_{PT}$ | $t_{SP}$ | $t_{CT}$ | $\Delta t = t_{CT} - t_{SP}$ |
|---|---|---|---|---|
| 1 | 1878.27 | 1821.26 | 1833.89 | 12.63 |
| 2 | 1791.09 | 1758.72 | 1776.79 | 18.07 |
| 3 | 1947.89 | 1893.51 | 1911.73 | 18.22 |
| 4 | 1834.71 | 1798.49 | 1816.67 | 18.18 |

All delays are in ps.

As an example and not by way of limitation, consider an experiment on the impact of crosstalk on gate delays and the relative contribution of gate delay changes to the path delay degradation $\Delta t$. For the chip $D_1$, for each path reported in Table 2, the sum of the gate delay changes due to crosstalk is computed. This is listed under the column $\Delta g$ in Table 2. The percentage fraction is shown in the column $$\frac{\Delta g}{\Delta t} (\%).$$

For instance, for Path 1, the crosstalk resulted in a delay increase of 41.02 picoseconds, out of which 34.29 picoseconds were contributed by the gate delay increase. Only a 6.73 picosecond increase was due to interconnect. For almost all paths, the contribution of gate delay change to $\Delta t$ is over 83%, which points to a significant impact of crosstalk on gate delays. Therefore, it is important to accurately model and compute not only interconnect delays, but also gate delays.

Regarding the accuracy of particular embodiments of the present invention, note from Table 2 that the PrimeTime delay $t_{PT}$ for a path p is different from $t_{SP}$ on average by 72.5 picoseconds. For all these paths, the PrimeTime delay values are greater. This significant difference, is possibly due to three factors: (1) PrimeTime reducing the interconnect at an output pin to a single $C_{eff}$ to compute the cell delay; (2) PrimeTime using a look-up-table based scheme to compute the cell delay; and (3) PrimeTime not computing the delay through interconnect as accurately as HSPICE. There are several cases where the interconnect delays computed by PrimeTime differ by more than 10% from those computed by HSPICE. Usually the PrimeTime-computed interconnect delays are smaller, which justifies the use of HSPICE in particular embodiments of the present invention.

The following data highlights the inaccuracy of net-based analysis next to path-based analysis for crosstalk. In net-based analysis, the maximum arrival time of a net is used to derive aggressors' waveforms. In design $D_1$, there is a critical net n with a maximum arrival time of $t_m$=4694 picoseconds. The net-based analysis results in aggressors switching at $t_m$. In this case, only one aggressor's timing window contains $t_m$. However, n is on two critical paths, and on one of these paths-Path 7 in Table 2—the arrival time of n was t=3520 picoseconds. Path 7 is not analyzed correctly using net-based analysis, since the aggressor switching time is forced to $t_m$, which is substantially different from the correct value t. The net-based analysis computed that the delay of Path 7 changed by less than 15 picoseconds over $t_{sp}$. However, in the path-based analysis of particular embodiments of the present invention, the switching times of aggressors are set at t instead of $t_m$. The net n has two aggressors with timing windows containing t. By setting the switching times of these two aggressors to t and carrying out the analysis, the delay of path 7 increases by more than 350 picoseconds over $t_{SP}$, as shown in Table 2. Path 10 provides a similar case. This example illustrates the inaccuracy inherent in the net-based crosstalk delay analysis (in terms of the aggressors that should switch and their switching times to model the worst-case scenario and its inability to distinguish different signal arrival times at a single net) and strengthens the case for a path-based analysis.

As an example and not by way of limitation, consider a comparison between the naive and smart approaches for cell delay characterization in the presence of crosstalk. As described above, the naive approach applies all possible input transitions to the side inputs of a cell, whereas the smart approach only applies the minimum set of vectors needed. On $D_1$, using the smart technique, the total number of HSPICE simulations for 36 paths was reduced from 484 for the naive method to 327: a reduction of 32%. The total runtime for characterization went down from 173 minutes to 109 minutes, a speed-up of 1.59. This underscores the effectiveness of the smart approach for delay computation.

Particular embodiments of the present invention include an analysis tool for measuring the impact of crosstalk on delays of critical paths in a design. The crosstalk-aware delay information is useable by designers to modify the design to reduce or even prevent crosstalk. Compared with other approaches, particular embodiments of the present invention provide high delay-computation accuracy. Particular embodiments avoid use of approximate models for cells and nets and interconnect reductions. Particular embodiments employ a path-based approach, use detailed and accurate distributed RC parasitics for critical nets and their aggressors, use BSIM3-accurate gate models, and invoke HSPICE for delay computation using only the minimum complete set of input patterns.

As described above, application of particular embodiments of the present invention to two real designs indicated that the crosstalk impact was much greater on one design $D_1$, since a significant number of critical net segments in the other design $D_2$ had no neighboring nets, owing to previous crosstalk optimization. As further described above, crosstalk tends to severely impact gate delays, which underscores the significance of modeling gate delays accurately.

As described above, previous net-based crosstalk estimation work is typically pessimistic and does not meet stringent accuracy requirements. On the other hand, an exhaustive path-based approach, though accurate, is impractical due to exponential numbers of paths in the design. A hybrid two-step methodology is a viable way to solve this problem. The first step prunes the number of paths that will be passed to the second step. In the first step, either a pessimistic net-based crosstalk analysis may be used to report a superset of actual paths that may violate timing requirements, or, as in other embodiments of the present invention, simply the most critical or near-critical paths may be chosen. The second step then accurately analyzes for crosstalk effects each of the paths selected in the first step and determines the true violations, as described above.

Particular embodiments of the present invention make substantial use of the extraction tool StarXtract (which is invoked once for each victim net) and HSPICE for cell delay characterization. Although smart pattern generation speeds up delay characterization, delay computation and extraction tend to create bottlenecks in the flow. Particular embodiments of the present invention are useful for analyzing up to approximately 150 paths. Beyond that, run-time may become large, depending on the total number of nets on the selected paths. Particular embodiments of the present invention may make use of faster extraction and circuit simulation techniques. Another solution is parallel computing. Parallelization may be carried out at various levels. Different paths may be analyzed in parallel. In addition or as an alternative, extraction for each victim net and its associated aggressors may be done in parallel. Also, during delay recomputation, multiple HSPICE invocations for a single stage may be done in parallel.

Particular embodiments of the present invention assume that, to capture the maximum impact on the victim delay, if the timing window of the aggressor contains the victim arrival time, the aggressor arrival time may be made to coincide with the victim arrival time. However, this may at times be impossible, since the timing window computed by PrimeTime contains information only about the minimum and maximum arrival times at a gate. Storing more detailed timing information may help alleviate this problem.

In particular embodiments of the present invention, for HSPICE simulation, the aggressor arrival time is derived from that of the victim net (for the path under consideration) as reported by PrimeTime. This is because the true victim arrival time in the presence of aggressors is typically not known beforehand. Table 2 shows discrepancies between PrimeTime and HSPICE numbers. The following may fix this problem. If the victim arrival time as reported by PrimeTime is different from that computed by HSPICE in the presence of coupling, say by more than 5 picoseconds, the new arrival time may be used to generate the aggressor waveform, and the delay characterization may be repeated. This fix may be expensive if the convergence is slow, in which case a limit on the maximum number of iterations may be useful.

Particular embodiments of the present invention do not check if there exists a pair of input vectors that will cause aggressors to make transitions in a direction opposite to that of the victim at a certain time. Such embodiments assume that such a pair exists. Such a check can be done using automatic test pattern generation (ATPG) or satisfiability checking (SAT), but the signal arrival times, transition times and gate delays should be incorporated. Particular embodiments of the present invention ignore any change in the timing window of an aggressor due to coupling at its transitive fan in nets.

FIG. 4 illustrates an example method for crosstalk-aware timing analysis. The method begins at step 100, where a crosstalk-analysis tool accesses a design of a circuit. At step 102, the crosstalk-analysis tool identifies one or more critical paths in the design. At step 104, the crosstalk-analysis tool identifies one or more potential aggressor interconnects associated with each victim interconnect. At step 106, the crosstalk-analysis tool extracts, for each victim interconnect, one or more parasitics associated with the victim interconnect and the one or more potential aggressor interconnects associated with the victim interconnect. At step 108, the crosstalk-analysis tool computes timing windows of the potential aggressor interconnects. At step 110, the crosstalk-analysis tool computes first timing of each cell and each victim interconnect on each critical path. At step 112, the cross-talk analysis tool generates timing waveforms of the potential aggressor interconnects according to the first timing of each cell and each victim interconnect on a first one of the critical paths, the timing windows of the potential aggressor interconnects, and the parasitics of the victim interconnects on the first critical path associated with the potential aggressor interconnects. At step 114, the cross-talk analysis tool traverses the first critical path from a start point on the first critical path to an end point on the first critical path. At step 116, using the timing waveforms of the potential aggressor interconnects, the parasitics of the victim interconnects on the first critical path associated with the potential aggressor interconnects, and any second timing of any immediately preceding cell on the first critical path, the cross-talk analysis tool computes a second timing of each cell and each victim interconnect on the first critical path according to the traversal of the first critical path.

At step 118, the cross-talk analysis tool communicates the second timing of each cell and each victim interconnect on the first critical path for analysis. At step 120, if the cross-talk analysis tool has analyzed all critical paths identified at step 102, the method ends. At step 120, if the cross-talk analysis tool has not analyzed all critical paths identified at step 102, the method proceeds to step 122. At step 122, the cross-talk analysis tool generates timing waveforms of the potential aggressor interconnects according to the first timing of each cell and each victim interconnect on a next one of the critical paths, the timing windows of the potential aggressor interconnects, and the parasitics of the victim interconnects on the next critical path associated with the potential aggressor interconnects. At step 124, the cross-talk analysis tool traverses the next critical path from a start point on the next critical path to an end point on the next critical path. At step 126, using the timing waveforms of the potential aggressor interconnects, the parasitics of the victim interconnects on the next critical path associated with the potential aggressor interconnects, and any second timing of any immediately preceding cell on the next critical path, the cross-talk analysis tool computes a second timing of each cell and each victim interconnect on the next critical path according to the traversal of the next critical path. At step 128, the cross-talk analysis tool communicates the second timing of each cell and each victim interconnect on the next critical path for analysis, and the method returns to step 120.

Although particular steps of the method illustrated in FIG. 4 have been illustrated and described as occurring in a particular order, the present invention contemplates any suitable steps of the method illustrated in FIG. 4 occurring in any suitable order. As an example and not by way of limitation, two or more suitable steps of the method illustrated in FIG. 4 may occur in parallel instead of serially.

Particular embodiments have been used to describe the present invention, and a person having skill in the art may comprehend one or more changes, substitutions, variations, alterations, or modifications to the particular embodiments used to describe the present invention. The present invention encompasses all such changes, substitutions, variations, alterations, and modifications within the scope of the appended claims.

What is claimed is:

1. A system for crosstalk-aware timing analysis, the system comprising:
a crosstalk analysis module operable to:
access a design of a circuit;
identify one or more critical paths in the design, each critical path comprising one or more victim interconnects and one or more cells;
identify one or more potential aggressor interconnects associated with each victim interconnect;
for each victim interconnect, extract one or more parasitics of the victim interconnect and the one or more potential aggressor interconnects associated with the victim interconnect;
compute timing windows of the potential aggressor interconnects;
compute a first timing of each cell and each victim interconnect on each critical path; and
for each critical path:
generate one or more timing waveforms of the potential aggressor interconnects according to the first timing of each cell and each victim interconnect on the critical path, the timing windows of the potential aggressor interconnects, and the parasitics of the victim interconnects on the critical path associated with the potential aggressor interconnects;
traverse the critical path from a start point on the critical path to an end point on the critical path; and
using the timing waveforms of the potential aggressor interconnects, the parasitics of the victim interconnects on the critical path associated with the potential aggressor interconnects, and any second timing of any immediately preceding cell on the critical path, compute a second timing of each cell and each victim interconnect on the critical path according to the traversal of the critical path.

2. The system of claim 1, wherein computation of the timing windows of the potential aggressor interconnects, computation of the first timing of each cell and each victim interconnect on the critical path, or both take crosstalk into account.

3. The system of claim 1, wherein computation of the timing windows of the potential aggressor interconnects, computation of the first timing of each cell and each victim interconnect on the critical path, or both do not take crosstalk into account.

4. The system of claim 1, wherein each timing window of each of the potential aggressor interconnects comprises minimum and maximum rise and fall arrival times and transition times.

5. The system of claim 1, wherein the first and second timings of each cell and each victim interconnect on the critical path comprise one or more of rise and fall arrival and transition times.

6. The system of claim 5, wherein the crosstalk analysis module is further operable to compute a rise or a fall arrival time of a cell or a victim interconnect on the critical path according to a sum of all delays through all cells and all victim interconnects on the critical path between the start point on the critical path and the cell or the victim interconnect on the critical path of which the crosstalk analysis module is computing the rise or the fall arrival time.

7. The system of claim 1, wherein the crosstalk analysis module is further operable to process each of two or more of the critical paths in parallel to generate the timing waveforms of the potential aggressor interconnects, traverse the critical path, and compute a second timing of each cell and each victim interconnect on the critical path.

8. The system of claim 1, wherein the crosstalk analysis module is further operable to extract parasitics of two or more victim interconnects in parallel.

9. The system of claim 1, wherein the crosstalk analysis module is further operable, to compute a second timing of a cell on a critical path, to run a plurality of simulations of the cell in parallel.

10. The system of claim 1, wherein the crosstalk analysis module is further operable to identify the critical paths in the design without taking crosstalk into account, without accurately modeling the design, or both.

11. The system of claim 1, wherein the crosstalk analysis module is further operable to identify the potential aggressor interconnects according to distances separating interconnects in the design from each other.

12. The system of claim 1, wherein the start point is an input pin on the critical path and the end point is an output pin on the critical path.

13. The system of claim 1, wherein one or more parasitics each comprise one or more of one or more distributed coupling capacitances, one or more self capacitances, and one or more resistances.

14. A method for crosstalk-aware timing analysis, the method comprising:
accessing a design of a circuit;
identifying one or more critical paths in the design, each critical path comprising one or more victim interconnects and one or more cells;
identifying one or more potential aggressor interconnects associated with each victim interconnect;
for each victim interconnect, extracting one or more parasitics of the victim interconnect and the one or more potential aggressor interconnects associated with the victim interconnect;
computing timing windows of the potential aggressor interconnects;

computing a first timing of each cell and each victim interconnect on each critical path; and for each critical path:
generating one or more timing waveforms of the potential aggressor interconnects according to the first timing of each cell and each victim interconnect on the critical path, the timing windows of the potential aggressor interconnects, and the parasitics of the victim interconnects on the critical path associated with the potential aggressor interconnects;

traversing the critical path from a start point on the critical path to an end point on the critical path; and using the timing waveforms of the potential aggressor interconnects, the parasitics of the victim interconnects on the critical path associated with the potential aggressor interconnects, and any second timing of any immediately preceding cell on the critical path, computing a second timing of each cell and each victim interconnect on the critical path according to the traversal of the critical path.

15. The method of claim 14, wherein computation of the timing windows of the potential aggressor interconnects, computation of the first timing of each cell and each victim interconnect on the critical path, or both take crosstalk into account.

16. The method of claim 14, wherein computation of the timing windows of the potential aggressor interconnects, computation of the first timing of each cell and each victim interconnect on the critical path, or both do not take crosstalk into account.

17. The method of claim 14, wherein each timing window of each of the potential aggressor interconnects comprises minimum and maximum rise and fall arrival times and transition times.

18. The method of claim 14, wherein the first and second timings of each cell and each victim interconnect on the critical path comprise one or more of rise and fall arrival and transition times.

19. The method of claim 18, further comprising computing a rise or a fall arrival time of a cell or a victim interconnect on the critical path according to a sum of all delays through all cells and all victim interconnects on the critical path between the start point on the critical path and the cell or the victim interconnect on the critical path of which the crosstalk analysis module is computing the rise or the fall arrival time.

20. The method of claim 14, further comprising processing each of two or more of the critical paths in parallel to generate the timing waveforms of the potential aggressor interconnects, traverse the critical path, and compute a second timing of each cell and each victim interconnect on the critical path.

21. The method of claim 14, further comprising extracting parasitics of two or more victim interconnects in parallel.

22. The method of claim 14, further comprising, to compute a second timing of a cell on a critical path, running a plurality of simulations of the cell in parallel.

23. The method of claim 14, further comprising identifying the critical paths in the design without taking crosstalk into account, without accurately modeling the design, or both.

24. The method of claim 14, further comprising identifying the potential aggressor interconnects according to distances separating interconnects in the design from each other.

25. The method of claim 14, wherein the start point is an input pin on the critical path and the end point is an output pin on the critical path.

26. The method of claim 14, wherein one or more parasitics each comprise one or more of one or more distributed coupling capacitances, one or more self capacitances, and one or more resistances.

27. Logic for crosstalk-aware timing analysis, the logic encoded in one or more media for execution and when executed by a computer is operable to:
access a design of a circuit;
identify one or more critical paths in the design, each critical path comprising one or more victim interconnects and one or more cells;
identify one or more potential aggressor interconnects associated with each victim interconnect;
for each victim interconnect, extract one or more parasitics of the victim interconnect and the one or more potential aggressor interconnects associated with the victim interconnect;
compute timing windows of the potential aggressor interconnects;
compute a first timing of each cell and each victim interconnect on each critical path; and
for each critical path:
generate one or more timing waveforms of the potential aggressor interconnects according to the first timing of each cell and each victim interconnect on the critical path, the timing windows of the potential aggressor interconnects, and the parasitics of the victim interconnects on the critical path associated with the potential aggressor interconnects;
traverse the critical path from a start point on the critical path to an end point on the critical path; and
using the timing waveforms of the potential aggressor interconnects, the parasitics of the victim interconnects on the critical path associated with the potential aggressor interconnects, and any second timing of any immediately preceding cell on the critical path, compute a second timing of each cell and each victim interconnect on the critical path according to the traversal of the critical path.

28. The logic of claim 27, wherein computation of the timing windows of the potential aggressor interconnects, computation of the first timing of each cell and each victim interconnect on the critical path, or both take crosstalk into account.

29. The logic of claim 27, wherein computation of the timing windows of the potential aggressor interconnects, computation of the first timing of each cell and each victim interconnect on the critical path, or both do not take crosstalk into account.

30. The logic of claim 27, wherein each timing window of each of the potential aggressor interconnects comprises minimum and maximum rise and fall arrival times and transition times.

31. The logic of claim 27, wherein the first and second timings of each cell and each victim interconnect on the critical path comprise one or more of rise and fall arrival and transition times.

32. The logic of claim 31, further operable to compute a rise or a fall arrival time of a cell or a victim interconnect on the critical path according to a sum of all delays through all cells and all victim interconnects on the critical path between the start point on the critical path and the cell or the victim interconnect on the critical path of which the crosstalk analysis module is computing the rise or the fall arrival time.

33. The logic of claim 27, further operable to process each of two or more of the critical paths in parallel to generate the timing waveforms of the potential aggressor interconnects, traverse the critical path, and compute a second timing of each cell and each victim interconnect on the critical path.

34. The logic of claim 27, further operable to extract parasitics of two or more victim interconnects in parallel.

35. The logic of claim 27, further operable, to compute a second timing of a cell on a critical path, to run a plurality of simulations of the cell in parallel.

36. The logic of claim 27, further operable to identify the critical paths in the design without taking crosstalk into account, without accurately modeling the design, or both.

37. The logic of claim 27, further operable to identify the potential aggressor interconnects according to distances separating interconnects in the design from each other.

38. The logic of claim 27, wherein the start point is an input pin on the critical path and the end point is an output pin on the critical path.

39. The logic of claim 27, wherein one or more parasitics each comprise one or more of one or more distributed coupling capacitances, one or more self capacitances, and one or more resistances.

40. A system for crosstalk-aware timing analysis, the system comprising:
- means for accessing a design of a circuit;
- means for identifying one or more critical paths in the design, each critical path comprising one or more victim interconnects and one or more cells;
- means for identifying one or more potential aggressor interconnects associated with each victim interconnect;
- means for, for each victim interconnect, extracting one or more parasitics of the victim interconnect and the one or more potential aggressor interconnects associated with the victim interconnect;
- means for computing timing windows of the potential aggressor interconnects;
- means for computing a first timing of each cell and each victim interconnect on each critical path; and
- means for, for each critical path:
  - generating one or more timing waveforms of the potential aggressor interconnects according to the first timing of each cell and each victim interconnect on the critical path, the timing windows of the potential aggressor interconnects, and the parasitics of the victim interconnects on the critical path associated with the potential aggressor interconnects;
  - traversing the critical path from a start point on the critical path to an end point on the critical path; and
  - using the timing waveforms of the potential aggressor interconnects, the parasitics of the victim interconnects on the critical path associated with the potential aggressor interconnects, and any second timing of any immediately preceding cell on the critical path, computing a second timing of each cell and each victim interconnect on the critical path according to the traversal of the critical path.

* * * * *

UNITED STATES PATENT AND TRADEMARK OFFICE
CERTIFICATE OF CORRECTION

PATENT NO. : 7,383,522 B2
APPLICATION NO. : 11/178111
DATED : June 3, 2008
INVENTOR(S) : Rajeev Murgai et al.

It is certified that error appears in the above-identified patent and that said Letters Patent is hereby corrected as shown below:

Column 5:
Line 7, after "the timing window of" delete "a" and insert -- $\alpha$ --.
Line 50, after "cofactor" delete "off" and insert -- of $f$ --.
Line 53, after "inputs" delete "off" and insert -- of $f$ --.

Column 6:
Line 64, delete "$\Delta = t_{cr} - t_{SP} - \geqq$" and insert -- $\Delta = t_{cr} - t_{SP} - \geq$ --.

Signed and Sealed this

Fourteenth Day of July, 2009

JOHN DOLL
*Acting Director of the United States Patent and Trademark Office*